United States Patent
Fogel et al.

(10) Patent No.: US 10,290,747 B2
(45) Date of Patent: May 14, 2019

(54) MIS CAPACITOR FOR FINNED SEMICONDUCTOR STRUCTURE

(71) Applicant: International Business Machines Corporation, Armonk, NY (US)

(72) Inventors: Keith E. Fogel, Hopewell Junction, NY (US); Pouya Hashemi, White Plains, NY (US); Shogo Mochizuki, Clifton Park, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/011,445

(22) Filed: Jun. 18, 2018

(65) Prior Publication Data

US 2018/0308993 A1 Oct. 25, 2018

Related U.S. Application Data

(63) Continuation of application No. 15/334,058, filed on Oct. 25, 2016, now Pat. No. 10,056,503.

(51) Int. Cl.
| | |
|---|---|
| *H01L 29/94* | (2006.01) |
| *H01L 29/66* | (2006.01) |
| *H01L 21/8234* | (2006.01) |
| *H01L 29/06* | (2006.01) |
| *H01L 27/06* | (2006.01) |

(52) U.S. Cl.
CPC ...... *H01L 29/94* (2013.01); *H01L 21/823431* (2013.01); *H01L 27/0629* (2013.01); *H01L 29/0657* (2013.01); *H01L 29/66181* (2013.01); *H01L 27/0635* (2013.01)

(58) Field of Classification Search
CPC ............ H01L 29/94; H01L 21/761; H01L 21/823431; H01L 29/0657; H01L 29/66181; H01L 27/0635
See application file for complete search history.

(56) References Cited

U.S. PATENT DOCUMENTS

| | | |
|---|---|---|
| 6,548,368 B1 | 4/2003 | Narwankar et al. |
| 6,947,275 B1 | 9/2005 | Anderson et al. |
| 6,995,412 B2 | 2/2006 | Fried et al. |
| 7,859,081 B2 | 12/2010 | Doyle et al. |
| 8,420,476 B2 | 4/2013 | Booth, Jr. et al. |
| 8,581,320 B1 | 11/2013 | Cheng et al. |
| 8,815,661 B1 | 8/2014 | Basker et al. |
| 8,921,198 B2 | 12/2014 | Booth, Jr. et al. |
| 9,142,548 B2 | 9/2015 | Zhang et al. |
| 9,196,672 B2 | 11/2015 | Tran et al. |
| 9,520,462 B1 | 12/2016 | Tran et al. |
| 2006/0208320 A1 | 9/2006 | Tsuchiya et al. |

(Continued)

*Primary Examiner* — Latanya N Crawford
(74) *Attorney, Agent, or Firm* — Daniel P. Morris, Esq.; Hoffmann & Baron, LLP

(57) ABSTRACT

MIS capacitors are formed using a finned semiconductor structure. A highly doped region including the fins is formed within the structure and forms one plate of a MIS capacitor. A metal layer forms a second capacitor plate that is separated from the first plate by a high-k capacitor dielectric layer formed directly on the highly doped fins. Contacts are electrically connected to the capacitor plates. A highly doped implantation layer having a conductivity type opposite to that of the highly doped region provides electrical isolation within the structure.

10 Claims, 5 Drawing Sheets

(56) References Cited

U.S. PATENT DOCUMENTS

| | | |
|---|---|---|
| 2010/0226166 A1* | 9/2010 | Jung ................ G11C 5/145 |
| | | 365/149 |
| 2012/0286343 A1 | 11/2012 | Matsuo |
| 2013/0113072 A1 | 5/2013 | Liu et al. |
| 2015/0097220 A1* | 4/2015 | Ponoth ............ H01L 27/0629 |
| | | 257/296 |
| 2015/0102392 A1 | 4/2015 | Yu et al. |
| 2015/0179503 A1 | 6/2015 | Tsai et al. |
| 2016/0329331 A1 | 11/2016 | Tsai et al. |
| 2017/0125419 A1 | 5/2017 | Jan et al. |

* cited by examiner

MIS CAPACITOR FOR FINNED SEMICONDUCTOR STRUCTURE

CROSS-REFERENCE TO RELATED APPLICATIONS

This patent application is a continuation of U.S. patent application Ser. No. 15/334,058 filed Oct. 25, 2016, entitled "MIS CAPACITOR FOR FINNED SEMICONDUCTOR STRUCTURE," the complete disclosure of which is expressly incorporated herein by reference in its entirety for all purposes.

BACKGROUND

The present disclosure relates generally to the electrical, electronic and computer arts and, more particularly, to metal-insulator-semiconductor (MIS) capacitors for use in association FinFET structures and the fabrication of such capacitors.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. Impurities can be introduced below the fins to provide a punch through stop (PTS). Punch through isolation of fins in bulk FinFET devices is provided to avoid leakage and is typically formed with the well implant. A relatively deep implant is required for relatively tall fins. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning. Gate-last procedures can involve forming a dummy gate, fabricating other elements of the transistor such as the source/drain regions, removing the dummy gate, and replacing the removed dummy gate with actual gate materials.

Disposable gate level layers may be lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form disposable gate structures.

Source/drain extension regions are formed after the disposable gate structures have been completed. A planarization dielectric layer is deposited over the semiconductor substrate, the disposable gate structures, and gate spacers on the disposable gate structures. The planarization dielectric layer may include a dielectric material that can be planarized, for example, by chemical mechanical planarization (CMP).

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are ordinarily formed in the gate cavities. Replacement gate structures are formed by replacement of the disposable structures and overlie channel regions of field effect transistors. A gate dielectric and a gate electrode are formed within each of the gate cavities. A gate dielectric layer can be deposited on the bottom surface and sidewall surfaces of each gate cavity and over the planarization dielectric layer. An electrically conductive material layer can be deposited on a work function material layer to form the remainder of the replacement gate. Portions of the gate conductor layer, the work function material layer(s), and the gate dielectric layer(s) are removed from the planarization dielectric layer by a planarization process. Replacement gate structures are thus formed, which include gate conductor layers, work function material layers, and gate dielectric layers.

Integrated circuits typically include both active semiconductor devices such as field-effect transistors (FETs) and passive devices such as capacitors and resistors. As CMOS technology has advanced, both active and passive devices have been scaled to increasingly smaller dimensions. Metal-insulator-metal (MIM) capacitors have been formed on finned structures to form integrated circuits including both FinFETs and capacitors. Such 3D capacitors can be employed for memory applications, oscillators, or as elements of other integrated circuits.

BRIEF SUMMARY

Techniques are provided for forming MIS capacitors on finned semiconductor structures.

In one aspect, an exemplary fabrication method includes obtaining a monolithic structure including a semiconductor substrate and a plurality of parallel semiconductor fins extending from the substrate. The parallel semiconductor fins are separated by spaces. The monolithic structure further includes a first doped layer within the substrate, the first doped layer having a first conductivity type. The fins and a top surface region of the substrate are doped in a first region of the substrate over the first doped layer such that they have a second conductivity type opposite from the first conductivity type and the doped top surface region of the substrate is electrically connected to the doped fins. The method further includes forming a capacitor dielectric layer directly on the fins and the top surface region of the substrate in the first region of the substrate and forming a metal layer on the capacitor dielectric layer. The metal layer extends into the spaces separating the fins in the first region of the substrate such that the metal layer, the capacitor dielectric layer, and the doped fins and doped top surface region form a metal-insulator-semiconductor capacitor in the first region of the substrate.

In another aspect, an exemplary monolithic structure includes a semiconductor substrate having a highly doped top surface region, a plurality of parallel, highly doped semiconductor fins extending from the substrate, the parallel semiconductor fins being separated by spaces and electrically connected to the highly doped top surface region. A first doped layer within the substrate is beneath the highly doped top surface region of the substrate and the highly doped semiconductor fins and has a first conductivity type. The semiconductor fins and the highly doped top surface region of the substrate have a second conductivity type opposite from the first conductivity type. A capacitor dielectric layer is directly on the semiconductor fins and the highly doped top surface region of the substrate. A metal layer on the capacitor dielectric layer extends into the spaces separating the semiconductor fins such that the metal layer, the capacitor dielectric layer, and the highly doped semiconductor fins and highly doped top surface region form a metal-insulator-semiconductor capacitor. A second dielectric layer is on the metal layer and a portion of the highly doped top surface region. A first contact within the second dielectric layer electrically communicates with the highly doped top surface region of the substrate and a second contact within the second dielectric layer electrically communicates with the metal layer.

Techniques as disclosed herein can provide substantial beneficial technical effects. By way of example only and without limitation, one or more embodiments may provide one or more of the following advantages:

Forming capacitors on finned semiconductor substrates having relatively closely spaced fins;

Enhancing capacitance of on-chip capacitors to reduce capacitor area and lower costs.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a finned structure including a MIS capacitor formed on the same substrate as one or more FinFETs. An exemplary fabrication method for forming the structure is further described.

Figure 1:
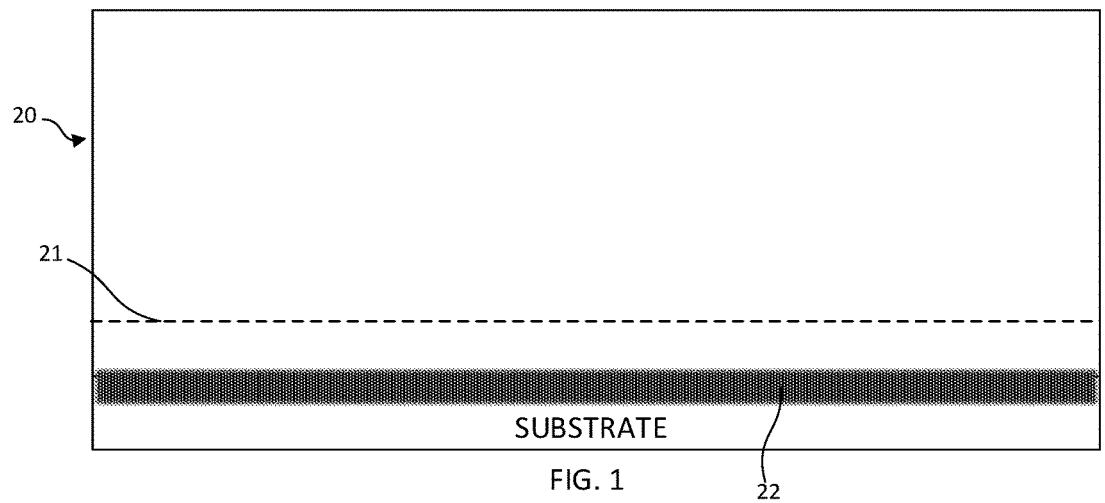
FIG. 1 is a schematic, cross-sectional view of a semiconductor substrate including an implanted deep well.

A bulk substrate 20 consisting essentially of undoped crystalline silicon is shown in FIG. 1, it being appreciated that standard silicon substrates may have a very low level of p-doping. The substrate may be in the form of a wafer. High energy ion implantation is employed to bury well dopants deep within the substrate 20, forming a doped implantation layer 22 beneath a level 21 within the substrate 20 that later corresponds to the base portions of an array of parallel semiconductor fins. The doping level of the doped implantation layer is $5 \times 10^{18}$ cm$^{-3}$ to $5 \times 10^{19}$ cm$^{-3}$ and the depth thereof is between five hundred and one thousand nanometers (500-1,000 nm) in one or more exemplary embodiments. It will be appreciated that deep well implantation may be used to form an implantation layer having the same or opposite conductivity type in one or more other regions of the substrate. The doping/conductivity type of the implantation layer 22 is the opposite of the doping type of the subsequently formed fins formed in the region of the substrate that is discussed further below. For example, deep well implantation forms an n++ layer 22 in embodiments wherein p++ fins are formed from the substrate. As used herein, the term "conductivity type" denotes a doped region (such as layer 22) being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. The doped implantation layer 22 electrically isolates the MIS capacitors that are subsequently formed using the substrate 20. It will be appreciated that while a fabrication process is described with respect to a silicon substrate, substrates comprising other semiconductor materials such as silicon germanium or III-V materials may alternatively be employed.

Figure 2:
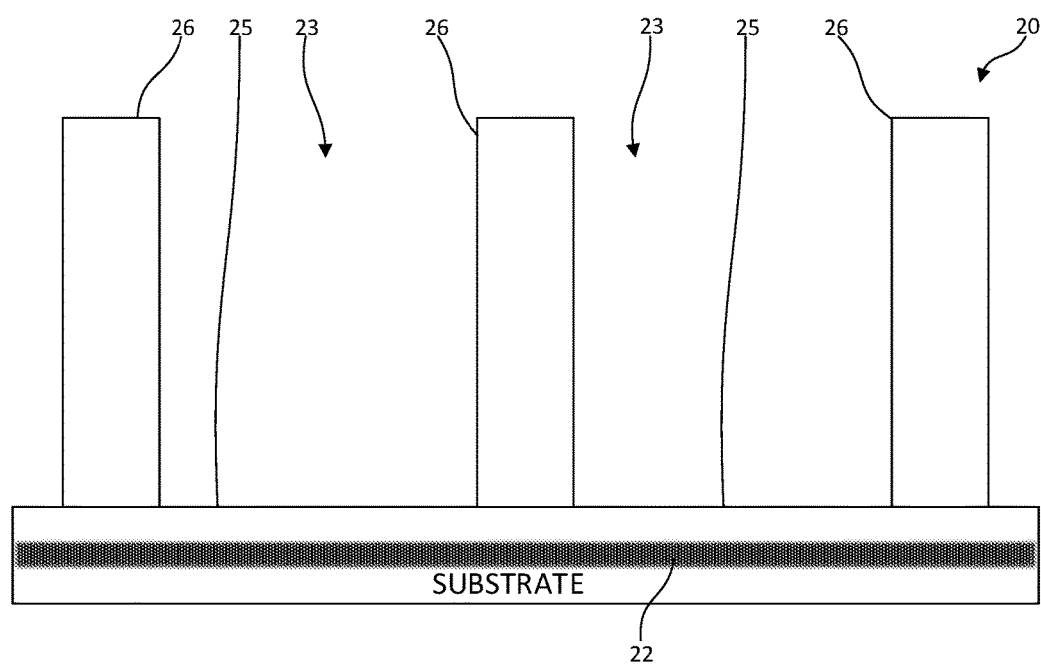
FIG. 2 is a schematic, cross-sectional view showing a finned structure including an array of fins formed from the semiconductor substrate.

FIG. 2 depicts a finned structure formed from the bulk silicon substrate 20, the finned structure including a plurality of parallel semiconductor fins 26 extending from the substrate 20. The fins can be formed using conventional processing of the substrate without penetrating the doped implantation layer 22. The height and width of the fins 26 and fin pitch are chosen to meet the specifications of the active and passive devices formed thereon. Fin pitch is 25-50 nm in some embodiments. In one exemplary embodiment, fin pitch is thirty-two nanometers (32 nm), fin width is eight nanometers (8 nm), and the spaces 23 between fins are twenty-four nanometers (24 nm). The exposed upper surfaces 25 of the substrate 20 between the fins 26 correspond to the level 21 shown in FIG. 1 such that the implantation layer 22 is located beneath both the surfaces 25 and the base portions of the fins 26. Methods of forming semiconductor fins 26 using photolithography or sidewall image transfer (SIT) are familiar to those of skill in the art. SIT facilitates the fabrication of fins that are smaller in spacing than photolithographic techniques permit. The SIT process forms features (such as fins) with a pitch equal to half of the smallest pitch obtainable with lithography. For example, with the state-of-the-art UV sources at 193 nm wavelength the smallest pitch that can be formed with conventional lithography is about 80 nm; the SIT process can generate fins with smaller fin pitch. It will be appreciated that the fins 26 may or may not have sidewalls that are entirely vertical. The bottoms of the fins 26 may in fact be larger in width than the top portions thereof. For example, if a substrate in an exemplary embodiment is a (100) substrate, the side wall surfaces of the semiconductor fins described as (110) surfaces are at least close to being (110) surfaces but may or may not be exactly (110) surfaces. Fin width dimensions are accordingly average dimensions where fin width is not uniform. Once the structure shown in FIG. 2 is obtained, selective cutting of one or more of the fins 26 is performed and the area(s) of the structure to be used to form FinFETs are masked with an oxide or nitride ($Si_3N_4$) layer (not shown).

Figure 3:
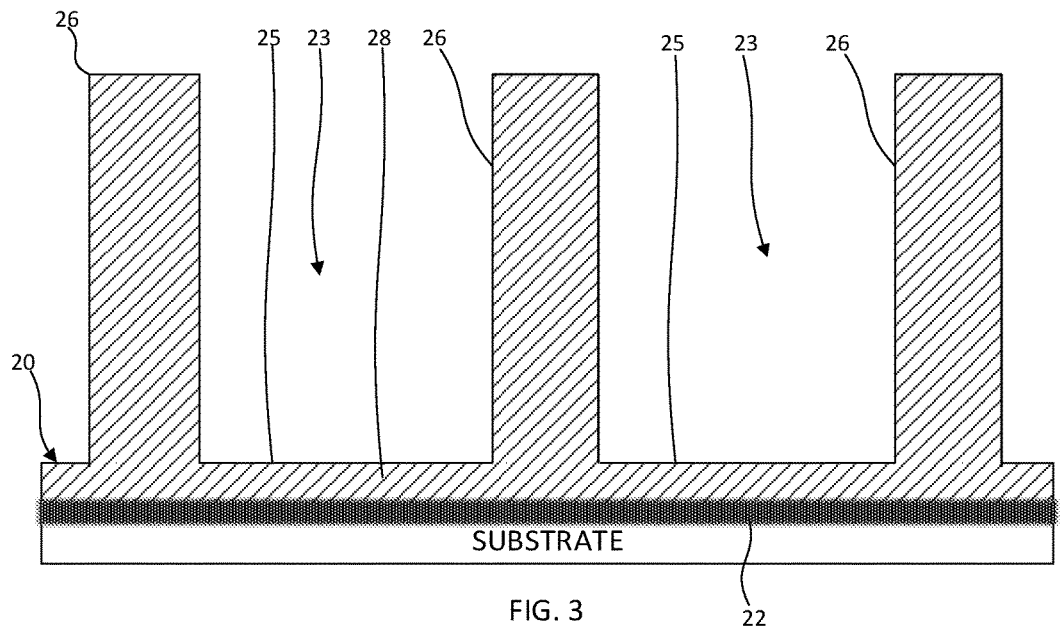
FIG. 3 is a further schematic, cross-sectional view thereof showing the finned structure following doping of the fins and the substrate surface.
Figure 4:
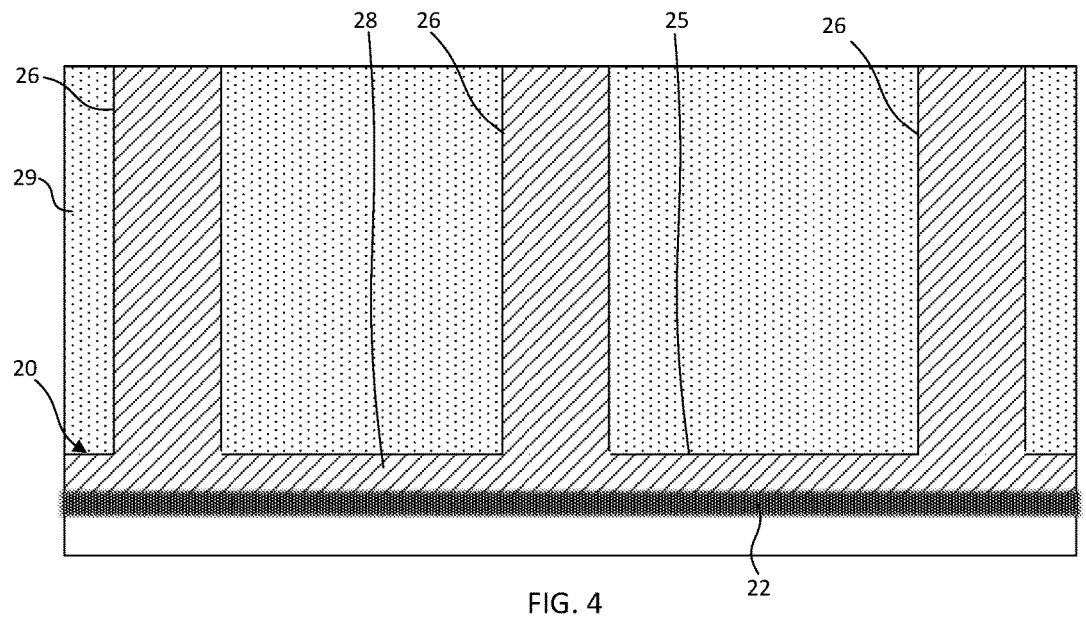
FIG. 4 is a schematic, cross-sectional view showing a hard mask formed on the array of fins.

With reference now to FIG. 3, fins 26 and the exposed surfaces 25 of the substrate are subjected to doping that provides uniformly doped fins and a doped top surface region or layer 28 adjoining the exposed substrate surfaces 25. The doped fins and the doped layer 28 form a continuous doped region directly above the oppositely doped implantation layer 22. Vapor phase doping techniques known to the art may be employed for doping the fins and forming the doped layer 28 within the substrate 20. As known in the art, vapor phase doping is performed at an elevated temperature range. If the fins are ten nanometers (8 nm) or less in thickness, the areas below the fins 26 are also doped although not directly exposed to the vapor. Diborane gas may be employed as a boron precursor to provide boron-doping of silicon fins and the exposed surface regions of a silicon substrate in some exemplary embodiments. The doping level is preferably high and is at least $5 \times 10^{19}$ cm$^{-3}$ to form p++ fins 26 and doped layers 28 in embodiments wherein the implantation layer 22 within the substrate 20 has n-type (preferably n++) conductivity. In an alternative embodiment, uniformly doped n++ fins are formed over a p++ implantation layer. The doped implantation layer 22 and the oppositely doped top surface layer 28 of the substrate 20 adjoin each other following vapor phase doping. These layers 22, 28 are also parallel to each other and to the plane of the exposed substrate surfaces 25. Once the structure shown in FIG. 3 is obtained, a hard mask 29 is formed on the structure to protect it through STI (shallow trench isolation) anneal and CMOS processing to form FinFETs (not shown) using the parallel fins in other region(s) of the substrate 20. FIG. 4 schematically illustrates a portion of the capacitor region of the structure including a nitride or oxide hard mask that is later removed for further processing thereof, as described below.

As known in the art, expanded source/drain regions (not shown) can be grown epitaxially on the exposed portions of the semiconductor fins 26 adjoining a dummy gate and associated spacers during the fabrication of FinFETs. Doped silicon or silicon germanium grown epitaxially on the sidewalls (110 surfaces) of silicon fins increases the volumes of the source/drain regions in some embodiments. Either p-type devices or n-type devices can be fabricated depending on the conductivity types of the epitaxial source/drain regions, as known in the art. In embodiments where n-type FinFET devices are to be formed, in-situ n-doped silicon may be used to form the epitaxial source/drain regions. In-situ doping of the source/drain regions can be conducted using conventional precursor materials and techniques. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $2 \times 10^{20}$-$2 \times 10^{21}$ cm$^{-3}$ and the resulting FinFET structure is p-type. In other embodiments, the source/drain semiconductor material is monocrystalline silicon, the dopant is phosphorus in a concentration in the range of $2 \times 10^{20}$ to $2 \times 10^{21}$ cm$^{-3}$ and the resulting FinFET structure is n-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 500° C. to 900° C. Once the source/drain regions have been formed, the structure is filled with an interlayer dielectric (ILD) and subjected to chemical mechanical planarization (CMP). The CMP process, for example poly-open planarization (POP), may be used to expose polysilicon gate tops (not shown). The dummy gates are removed by a process such as reactive ion etching (RIE) and/or wet chemical etching to form recesses (not shown) bounded by the sidewall spacers. Exposed portions of the fins 26 to be used as channel regions of subsequently formed FinFET devices are later filled with a gate dielectric layer, a work function setting material, and metal gate as part of a "gate-last" fabrication (RMG) process.

Figure 5:
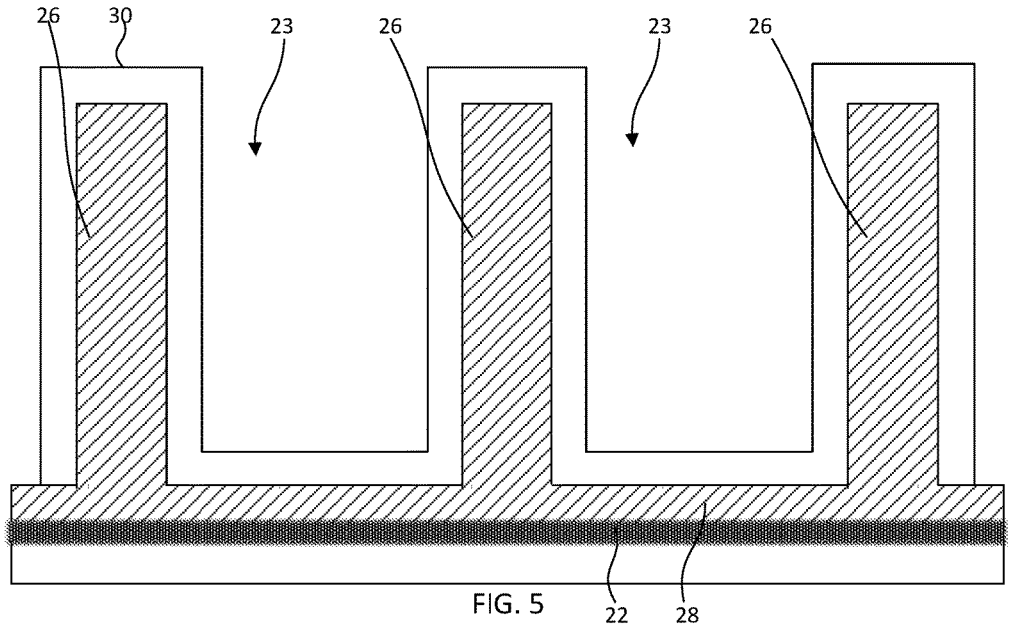
FIG. 5 is a schematic, cross-sectional view showing the finned structure following removal of the hard mask and deposition of a dielectric layer.

As shown in FIG. 5, a capacitor dielectric layer 30 is deposited on the region(s) of the structure including the highly doped fins 26 and doped substrate layers 28 following hard mask 29 removal. The dielectric layer 30 is in direct contact with the top and sidewalls of the fins and the exposed top surface 25 of the substrate between the fins. A high-k gate dielectric layer having a thickness of about three nanometers (3 nm) is conformally deposited in some embodiments. The thickness of the dielectric layer can vary depending on the dimensions of the spaces 23 that separate the fins 26 and/or the desired electrical characteristics of the MIS capacitor to be obtained. Atomic layer deposition (ALD) can, for example be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The dielectric layer used in some devices may alternatively include a multi-layer of $SiO_2$, SiON, SiN, and a high-k dielectric material, including but not limited to hafnium oxide (HfO$_2$), aluminium oxide (Al$_2$O$_3$), lanthanum oxide (La$_2$O$_3$), zirconium oxide (ZrO$_2$), and their respective silicates. Post-deposition annealing (PDA) is conducted in accordance with conventional processing procedures.

Figure 6:
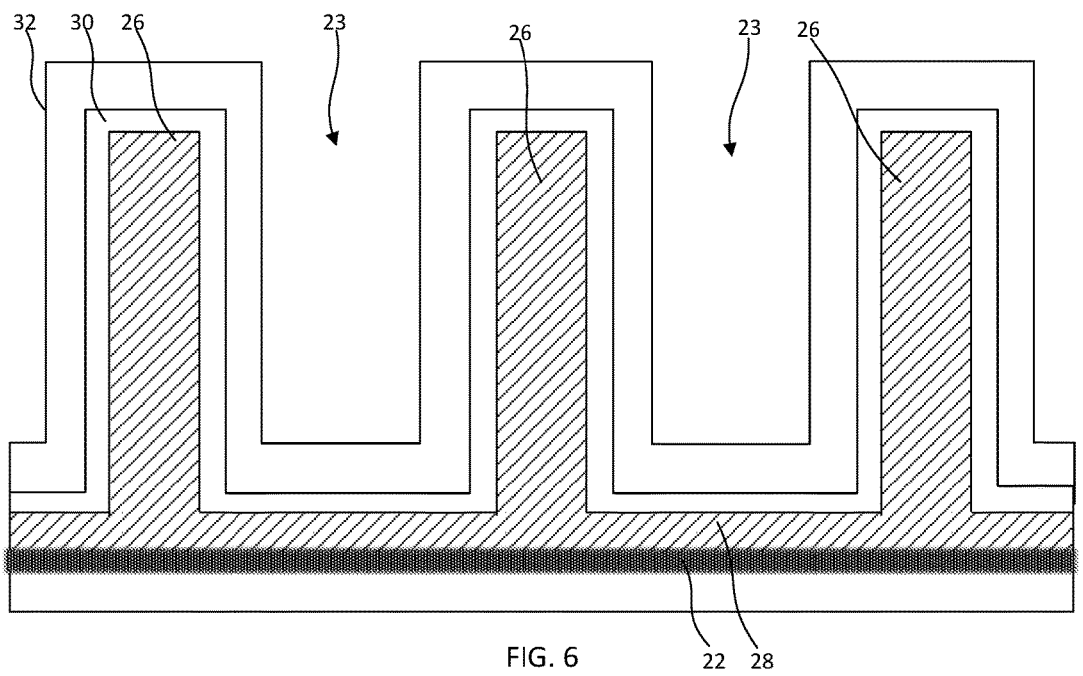
FIG. 6 is a schematic, cross-sectional view showing the finned structure following deposition of a metal layer.

A metal layer 32 is deposited directly on the dielectric layer 30 as shown in FIG. 6. In an exemplary embodiment, a titanium nitride (TiN) film layer is conformally deposited on the high-k dielectric layer using 30, for example, an ALD process. The metal layer 32 may have a thickness of about 50 Å (five nanometers) in embodiments wherein the space between fins is relatively tight. The metal layer 32 and the underlying capacitor dielectric layer 30 can have greater thicknesses if formed on substrates having sufficient fin spacing. The combined thicknesses of the dielectric layer 30 and metal layer 32 in the spaces 23 between each fin would, in some embodiments, total sixteen nanometers assuming a metal layer thickness of five nanometers and a capacitor dielectric layer of three nanometers. They would accordingly be suitable for use in structures having a fin pitch of thirty-two nanometers where fin width is ten nanometers or less. In the exemplary embodiment of FIG. 6, the metal layer 32 is formed as a liner, which leaves portions of the spaces 23 between fins unfilled. A MIS capacitor comprising one or more highly doped fins 26, the metal layer 32, and the capacitor dielectric layer 30 is accordingly provided. It will be appreciated that the "metal" layer of the MIS capacitor, while electrically conductive, may or may not be chemically classified as a metal. Titanium nitride can, for example, be considered a ceramic material rather than a metal. The metal layer includes multiple layers in some embodiments, for example a titanium nitride layer and a tungsten or cobalt layer over the titanium nitride layer (TiN/W or TiN/Co). Chemical vapor deposition conducted between 300-400° C. using tungsten hexafluoride precursor chemistry may, for example, be employed to deposit a tungsten layer. Cobalt may, for example, be deposited using a metal-organic precursor in a CVD process at a temperature range of 150-200° C. Ruthenium may be deposited using thermal CVD at 1.5 Torr and at a process temperature of 250-350° C. In one exemplary embodiment, a ruthenium layer is deposited using PECVD at a processing temperature in the range of 250-350° C. at 1.5 Torr with 400-600 W plasma power until a layer between 0.5-2.0 nm is formed.

Figure 7:
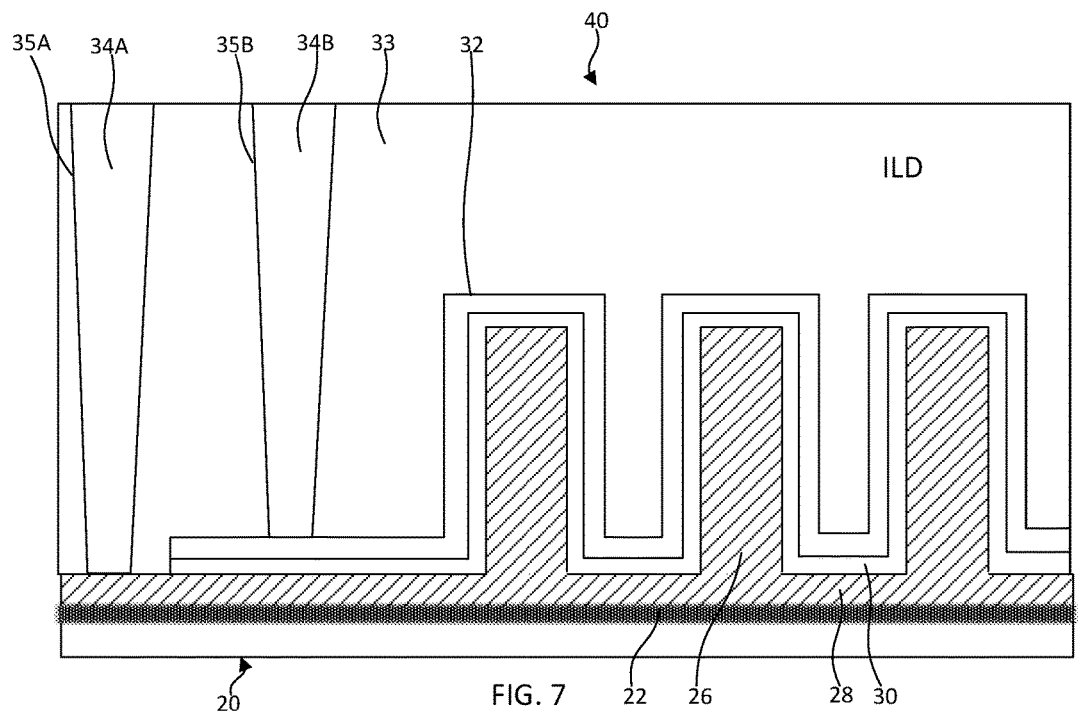
FIG. 7 is a schematic, cross-sectional view showing the finned structure following deposition of a dielectric layer and contact formation.

Once the MIS capacitor(s) have been formed and possibly other processing steps are completed, an electrically insulating interlayer dielectric (ILD) layer 33 as shown in FIG. 7 is deposited on the structure and about the MIS capacitor(s). In this exemplary embodiment, the ILD layer 33 fills the portions of the spaces 23 between the fins 26 that remain following deposition of the metal liner. The layer 33, for example silicon dioxide, can be formed using CVD or other known techniques. The electrically insulating layer 33 is planarized prior to contact formation and is then patterned using a photoresist layer (not shown) and etched to form trenches 35A, 35B. The trenches extend, respectively, to the highly doped layer 28 adjoining the substrate surface and the metal layer 32, respectively. The ILD layer 33 comprises multiple dielectric layers in some embodiments.

FIG. 7 shows a completed structure 40 including metal contacts 34A, 34B formed within the trenches 35A, 35B and electrically communicating with the plates (highly doped fins 26 and top surface regions 28, metal layer 32) of the MIS capacitor. The contacts 34A, 34B may be formed using metallization schemes known to the art or which may be developed in the future. Titanium (Ti), titanium nitride (TiN) and tungsten (W) layers can, for example, be used as liner/barrier/nucleation layers in MOL metallization. In some embodiments, the contacts are formed using at least two deposition stages. The first stage includes a plasma-enhanced deposition process such as plasma-enhanced chemical vapor deposition (PECVD) or plasma-enhanced atomic layer deposition (PEALD). During the first stage, a continuous layer of contact metal such as ruthenium is formed directly on surfaces of the dielectric layer bounding the trenches 35A, 35B. In one exemplary embodiment, a ruthenium layer is deposited using PECVD at a processing temperature in the range of 250-350° C. at 1.5 Torr with 400-600 W plasma power until a layer between 0.5-2.0 nm is formed. The thickness of the layer should be sufficient to ensure the absence of discontinuities in the layer formed on the dielectric surfaces during the first deposition stage. Following completion of the first stage, which in some embodiments includes multiple plasma-enhanced deposition steps, the second stage includes the thermal chemical vapor deposition (CVD) of contact metal. In one exemplary embodiment, ruthenium is deposited for 25-275 seconds at 1.5 Torr and at a process temperature of 250-350° C. The PECVD process provides good nucleation while thermal CVD provides improved contact metal coverage on the trench sidewalls as compared to PECVD. Ruthenium metallization, for example, reduces interconnect resistance as compared to liner/barrier/nucleation films often used in MOL metallization. The use of a non-halide precursor molecule, for example a metal-organic precursor as known in the art, eliminates the need for a halide-diffusion barrier. Being a high temperature refractory metal, there are no concerns relating to electromigration when employing ruthenium during both stages of the MOL metallization as described herein. Bulk resistivity of ruthenium is about 7.1 μOhm-cm. The metallization step in the region(s) of the substrate 20 including MIS capacitors may or may not be concurrent with contact formation in the region(s) in which FinFETs have been formed. As known in the art, self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material of the FinFETs.

FIGS. 1-7, as discussed above, depict exemplary processing steps/stages in the fabrication of a monolithic structure 40 including MIS capacitor(s) and FinFET devices. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

Figure 8:
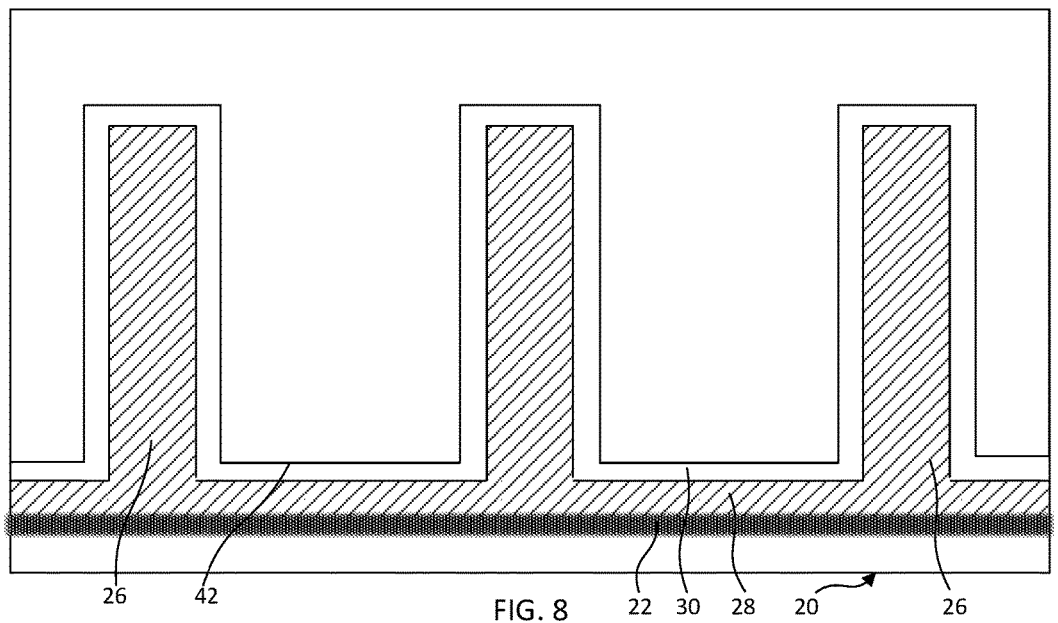
FIG. 8 is a schematic, cross-sectional view showing a further embodiment showing the finned structure following deposition of a metal layer that completely encapsulates the fins and dielectric layer.
Figure 9:
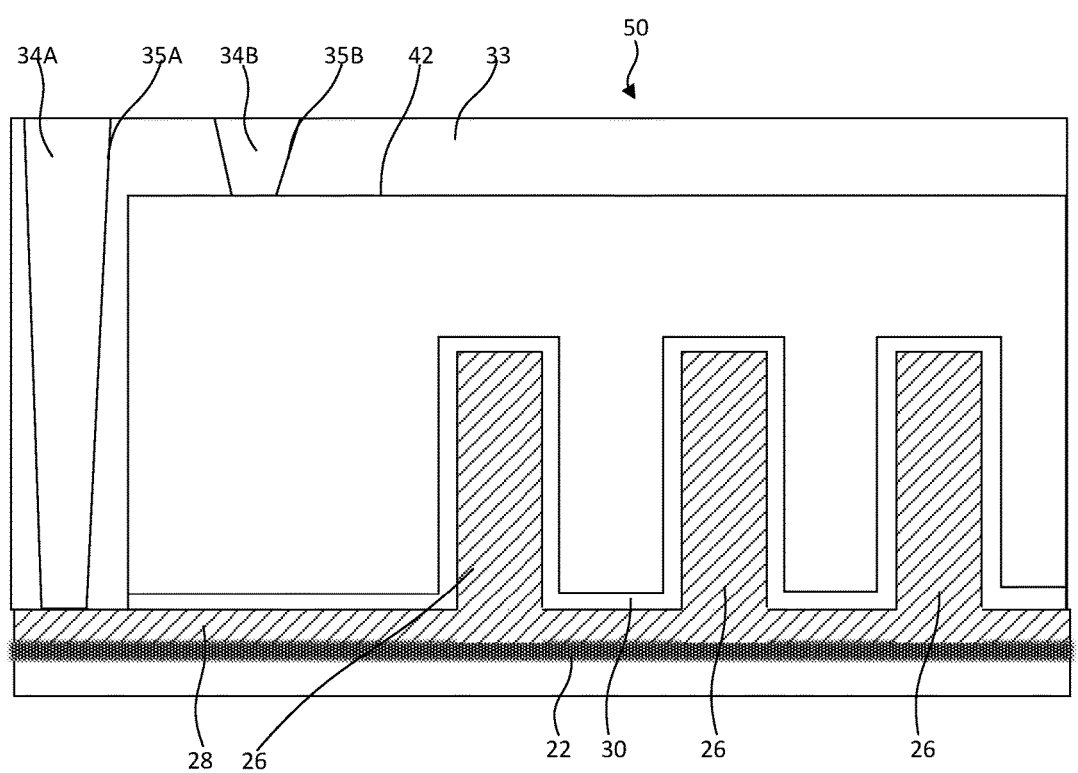
FIG. 9 is a schematic, cross-sectional view showing the finned structure of FIG. 8 following deposition of a dielectric layer and contact formation.

In an alternative embodiment, steps as described above with respect to FIGS. 1-5 may be employed and, rather than forming the metal layer 32 as a metal liner on the capacitor dielectric layer 30, the metal layer completely fills the portions of the spaces 23 between fins that are bounded by the capacitor dielectric layer 30. FIG. 8 schematically illustrates a structure including a metal layer 42 that fills the spaces 23 and extends over the tops of the fins 26 and capacitor dielectric layer 30. The metal layer 42 is planarized using chemical mechanical planarization (CMP). The metal layer 42 is a combination of layers in some embodiments, as discussed above with respect to metal layer 32. The ILD layer 33 is deposited on the metal layer 42 and the highly doped top surface region 28 outside the metal layer and planarized. Trenches 35A, 35B are formed in the ILD layer 33 down to the highly doped top surface region 28 of the substrate 20 and the metal layer 42, respectively. Contacts 34A, 34B within the trenches electrically communicate with the highly doped top surface region 28 of the substrate 20 and the metal layer 42, respectively. A monolithic structure 50 as schematically illustrated in FIG. 9 is accordingly obtained. The MIS capacitors shown in FIGS. 7 and 9 function similarly, though the increased metal content in the embodiment of FIG. 9 compared to that within the monolithic structure 40 is characterized by lower electrical resistance.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a monolithic structure including a semiconductor substrate 20 and a plurality of parallel semiconductor fins 26 extending from the substrate. The parallel semiconductor fins are separated by spaces 23. The monolithic structure further includes a first doped layer 22 within the substrate, the first doped layer having a first conductivity type. FIG. 2 schematically illustrates an exemplary monolithic structure. The semiconductor fins 26 and a top surface region of the substrate are doped in a first region of the substrate above the first (implanted) doped layer 22 such that they have a second conductivity type opposite from the first conductivity type and the top surface region 28 of the substrate is electrically connected to the doped fins 26. The method further includes forming a capacitor dielectric layer 30 directly on the fins and the top surface region of the substrate in the first region of the substrate and forming a metal layer 32 on the capacitor dielectric layer. The metal layer extends into the spaces 23 separating the fins in the first region of the substrate such that the metal layer, the capacitor dielectric layer, and the doped fins and doped top surface region form a metal-insulator-semiconductor (MIS) capacitor in the first region of the substrate. In one or more embodiments, a second dielectric layer 33 is formed on the metal layer. First and second contacts 34A, 34B are formed within the second dielectric layer, as schematically illustrated in FIGS. 7 and 9. The first contact 34A electrically communicates with the doped top surface region 28 of the substrate and thereby electrically communicates with the doped fins 26. The second contact 34B electrically communicates with the metal layer 32. The method may further include forming a plurality of FinFET devices in a second region of the substrate 20 using one or more of the plurality of parallel semiconductor fins in the second region and electrically connecting the metal-insulator-semiconductor capacitor to one or more of the FinFET devices. In one or more embodiments, the fins 26 and the top surface region 28 of the substrate 20 comprise a contiguous p++ region and the first doped layer 22 comprises an n++ region beneath the p++ region. As used in this context, the term "contiguous" means there is no boundary in the doped p++ region (or n++ region in alternative embodiments) that includes the semiconductor fins and the top surface region. As discussed above, the p++ and n++ regions adjoin each other within the substrate 20 with the n++ implantation layer being beneath the contiguous doped p++ region that includes the fins. In some embodiments, the metal layer 32 is formed as a liner on the capacitor dielectric layer 30, in which case the second dielectric layer fills portions of the spaces 23 between the fins 26 in the first region of the substrate. FIG. 7 schematically illustrates a monolithic structure 40 including a metal liner that forms a plate of the MIS capacitor. In an alternative embodiment as schematically illustrated in FIGS. 8-9, the metal layer 42 completely fills portions of the spaces between the fins between opposing portions of the capacitor dielectric layer 30 in the first region of the substrate and includes a top surface planarized using CMP.

Given the discussion thus far, it will also be appreciated that an exemplary monolithic structure is provided that includes a semiconductor substrate 20 having a highly doped top surface region 28. A plurality of parallel, highly doped semiconductor fins 26 extend from the substrate. The parallel semiconductor fins are separated by spaces 23 and are electrically connected to the doped top surface region 28. A first doped layer 22 is beneath the highly doped top surface region 28 of the substrate 20 and has a conductivity type opposite to that of the semiconductor fins and the highly doped top surface region. A capacitor dielectric layer 30 directly contacts the semiconductor fins and the highly doped top surface region of the substrate. The term "highly doped" as employed herein means the doping of the semiconductor fins 26 and top surface region 28 of the substrate is sufficient to form a plate of a MIS capacitor. A metal layer (32 in FIG. 7, 42 in FIG. 9) adjoins the capacitor dielectric layer and extends into the spaces 23 separating the semiconductor fins such that the metal layer, the capacitor dielectric layer, and the semiconductor fins and highly doped top surface region form a metal-insulator-semiconductor (MIS) capacitor. A second dielectric layer is on the metal layer. A first contact 34A within the second dielectric layer electrically communicates with the highly doped top surface region of the substrate and a second contact 34B therein electrically communicates with the metal layer 32 or 42. In some embodiments, the parallel fins 26 have a pitch of thirty-two nanometers or less and widths of ten nanometers or less.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having MIS capacitors and FinFET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can possibly be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic structure including one or more metal-insulator-semiconductor (MIS) capacitors, the monolithic structure comprising:
   a semiconductor substrate having a highly doped top surface region;
   a plurality of parallel, highly doped semiconductor fins extending vertically from the substrate, the semiconductor fins being separated from one another by spaces and electrically connected to the highly doped top surface region;
   a first doped layer within the substrate, the first doped layer being directly beneath at least base portions of the highly doped semiconductor fins and the highly doped top surface region of the substrate and having a first conductivity type, the semiconductor fins and the highly doped top surface region of the substrate having a second conductivity type opposite from the first conductivity type, the first doped layer being parallel to the highly doped top surface region of the substrate;
   a capacitor dielectric layer directly on the semiconductor fins and the highly doped top surface region of the substrate;
   a metal layer on the capacitor dielectric layer and extending into the spaces separating the semiconductor fins such that the metal layer, the capacitor dielectric layer, and the semiconductor fins and highly doped top surface region form a metal-insulator-semiconductor capacitor;
   a second dielectric layer on the metal layer and a portion of the highly doped top surface region;
   a first contact within the second dielectric layer that electrically communicates with the highly doped top surface region of the substrate, and
   a second contact within the second dielectric layer that electrically communicates with the metal layer;
   wherein the metal layer on the capacitor dielectric layer forms a metal liner, and the second dielectric layer adjoins the metal liner and extends into the spaces separating the semiconductor fins in a first region of the substrate.

2. The monolithic structure of claim 1, wherein the semiconductor fins and the top surface region of the substrate comprise a contiguous p++ region and the first doped layer comprises an n++ region beneath and adjoining the p++ region.

3. The monolithic structure of claim 1, wherein the metal layer on the capacitor dielectric layer completely fills portions of the spaces between the semiconductor fins between opposing surfaces of the capacitor dielectric layer in a first region of the substrate and has a planarized top surface, the second dielectric layer including a first portion positioned entirely above the semiconductor fins in the first region of the substrate and adjoining the planarized top surface of the metal layer and a second portion adjoining the highly doped top surface region.

4. The monolithic structure of claim 1, wherein the semiconductor fins have a pitch of thirty-two nanometers or less and widths of ten nanometers or less.

5. The monolithic structure of claim 4, wherein the capacitor dielectric layer comprises a high-k material.

6. The monolithic structure of claim 5, wherein the semiconductor fins and the highly doped top surface region of the substrate comprise a contiguous p++ region and the first doped layer comprises an n++ region beneath and adjoining the p++ region.

7. The monolithic structure of claim 6, wherein the substrate is a bulk silicon substrate and the semiconductor fins are integral with the bulk silicon substrate.

8. The monolithic structure of claim 5, wherein the semiconductor fins and the top surface region of the substrate comprise a contiguous n++ region and the first doped layer comprises a p++ region beneath and adjoining the n++ region.

9. The monolithic structure of claim 1, further comprising at least one FinFET device, at least one of the one or more MIS capacitors being electrically connected to the at least one FinFET device.

10. The monolithic structure of claim 1, wherein the first doped layer is formed as a deep well implant within the substrate, and wherein the plurality of semiconductor fins are formed above the deep well implant without penetrating the deep well implant.

* * * * *